(12) United States Patent
Shih et al.

(10) Patent No.: US 8,183,701 B2
(45) Date of Patent: May 22, 2012

(54) STRUCTURE OF STACKING SCATTEROMETRY BASED OVERLAY MARKS FOR MARKS FOOTPRINT REDUCTION

(75) Inventors: Chi-Yuan Shih, Hsinchu (TW); Sophia Wang, Xin-Zhu (TW); Heng-Hsin Liu, Yonghe (TW); Heng-Jen Lee, Baoshan Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 267 days.

(21) Appl. No.: 12/511,638

(22) Filed: Jul. 29, 2009

(65) Prior Publication Data
US 2011/0024924 A1 Feb. 3, 2011

(51) Int. Cl.
*H01L 23/544* (2006.01)
*H01L 21/00* (2006.01)

(52) U.S. Cl. .. 257/797; 438/401; 438/462; 257/E23.179
(58) Field of Classification Search .................. None
See application file for complete search history.

(56) References Cited

U.S. PATENT DOCUMENTS

| 6,420,791 B1 * | 7/2002 | Huang et al. ................... 257/797 |
| 7,288,461 B2 * | 10/2007 | Chia et al. ..................... 438/401 |
| 7,289,213 B2 | 10/2007 | Mieher et al. |
| 7,289,214 B1 | 10/2007 | Li et al. |
| 7,825,529 B2 * | 11/2010 | Horii .............................. 257/797 |
| 2009/0206411 A1 * | 8/2009 | Koketsu et al. ............... 257/368 |

* cited by examiner

*Primary Examiner* — Alonzo Chambliss
(74) *Attorney, Agent, or Firm* — Haynes and Boone, LLP

(57) ABSTRACT

The present disclosure provides an integrated circuit. The integrated circuit includes a semiconductor substrate; a plurality of material layers formed on the semiconductor substrate, each of the material layers including a circuit pattern therein; and a plurality of diffraction-based periodic marks formed in the plurality of material layers and stacked in a same region. One of the diffraction-based periodic marks is different from at least one other of the diffraction-based periodic marks in pitch.

13 Claims, 4 Drawing Sheets

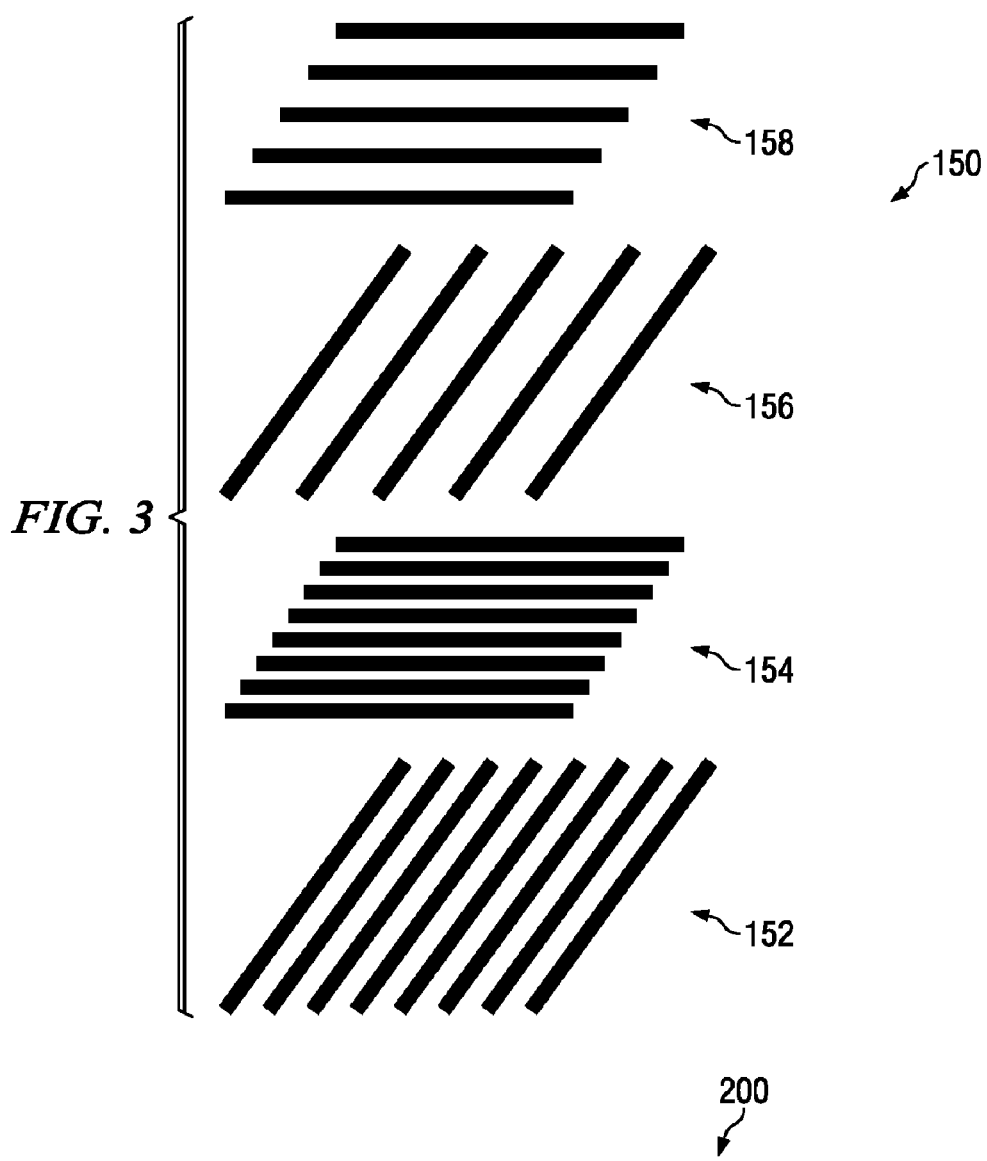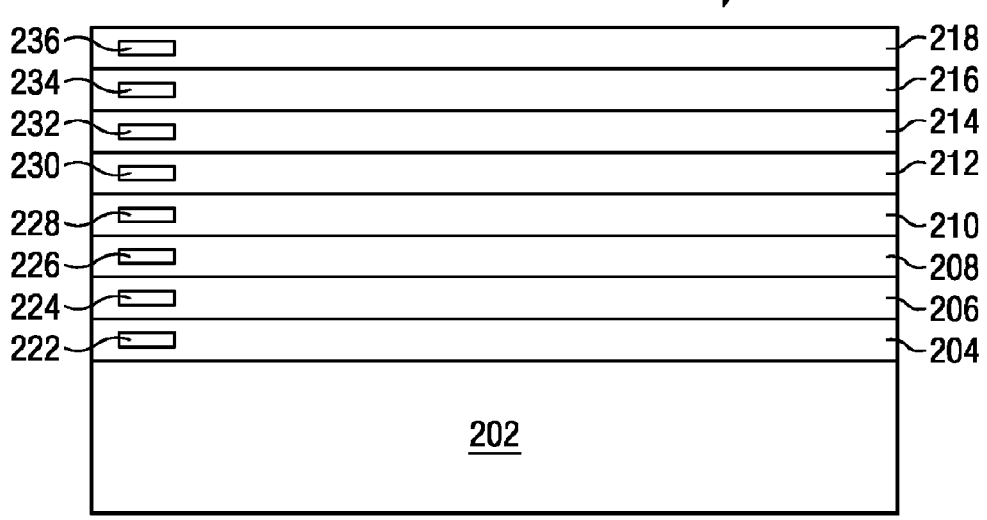

| PASSIVATION | | | | |
|---|---|---|---|---|
| TM1 | | B | | |
| TV1 | A | B | | |
| M10 | A | | C | |
| VA9 | | | C | D |
| M9 | X | | B | D |
| VA8 | X | B | B | |
| M8 | | B | A | |
| VA7 | | A | A | |
| M7 | B | A | X | |
| VA6 | B | | X | C |
| M6 | A | X | | C |
| VA5 | A | X | | B |
| M5 | X | | B | B |
| VA4 | X | | B | A |
| M4 | | | A | A |
| VA3 | | D | A | |
| M3 | D | D | X | |
| VA2 | D | C | X | |
| M2 | C | C | | |
| VA1 | C | B | | |
| M1 | B | B | | |
| CT | B | A | A | |
| PO | A | A | | |
| OD | A | | A | |
| LOCATION | 1 | 2 | 3 | 4 |

300

US 8,183,701 B2

STRUCTURE OF STACKING SCATTEROMETRY BASED OVERLAY MARKS FOR MARKS FOOTPRINT REDUCTION

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, alignment marks are used for alignment between a photomask and the semiconductor wafer. In another example, overlay marks are used to monitor overlay deviation between the layers on the wafer. As semiconductor technology continues progressing to circuit layouts having smaller feature sizes, the alignment requirement becomes more stringent and the alignment/overlay marks are expected to take less wafer area. Stacked marks are used with various blocking layers. For example, a blocking layer is inserted between a top pair of overlay marks and a bottom pair of overlay marks stacked. Furthermore, a minimum vertical spacing between the bottom pair of overlay marks and the blocking layer to ensure effective signal blocking. In this situation, extra processing steps and more chip area are needed, resulting higher manufacturing cost and chip cost. It is desired, therefore, to provide a method and a structure for monitoring and controlling alignment and overlay with less footprint.

SUMMARY

The present disclosure provides an embodiment of an integrated circuit. The integrated circuit includes a semiconductor substrate; a plurality of material layers formed on the semiconductor substrate, each of the material layers including a circuit pattern therein; and a plurality of diffraction-based periodic marks formed in the plurality of material layers and stacked in a same region, wherein one of the diffraction-based periodic marks is different from at least one other of the diffraction-based periodic marks in pitch.

The present disclosure also provides another embodiment of an integrated circuit. The integrated circuit includes a plurality of material layers formed on a substrate; and a plurality of pair of grating marks formed in the plurality of material layers and stacked in a same region of the substrate when viewed in a direction perpendicular to the substrate, each pair of the grating marks having a periodic structure with a pitch and an orientation, wherein one pair of the grating marks formed in adjacent two of the material layers and being different from other pairs of the grating marks in at least one of the pitch and the orientation.

The present disclosure also provides a method that includes forming stacked grating marks on a wafer, the grating marks being designed with various pitches and orientations; directing a first light beam to the stacked grating marks, wherein the first light beam is selected to have a first wavelength such that an intended one of the stacked grating marks is in a detection field and some other of the stacked grating marks are out of the detection field; and detecting a diffracted light pattern from the intended one of the stacked grating marks.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIG. 3 is a schematic view of one embodiment of stacked scatterometry-based marks configured according to aspects of the present disclosure.

FIG. 4 is a sectional view of one embodiment of an integrated circuit wafer having scatterometry-based marks configured according to aspects of the present disclosure.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
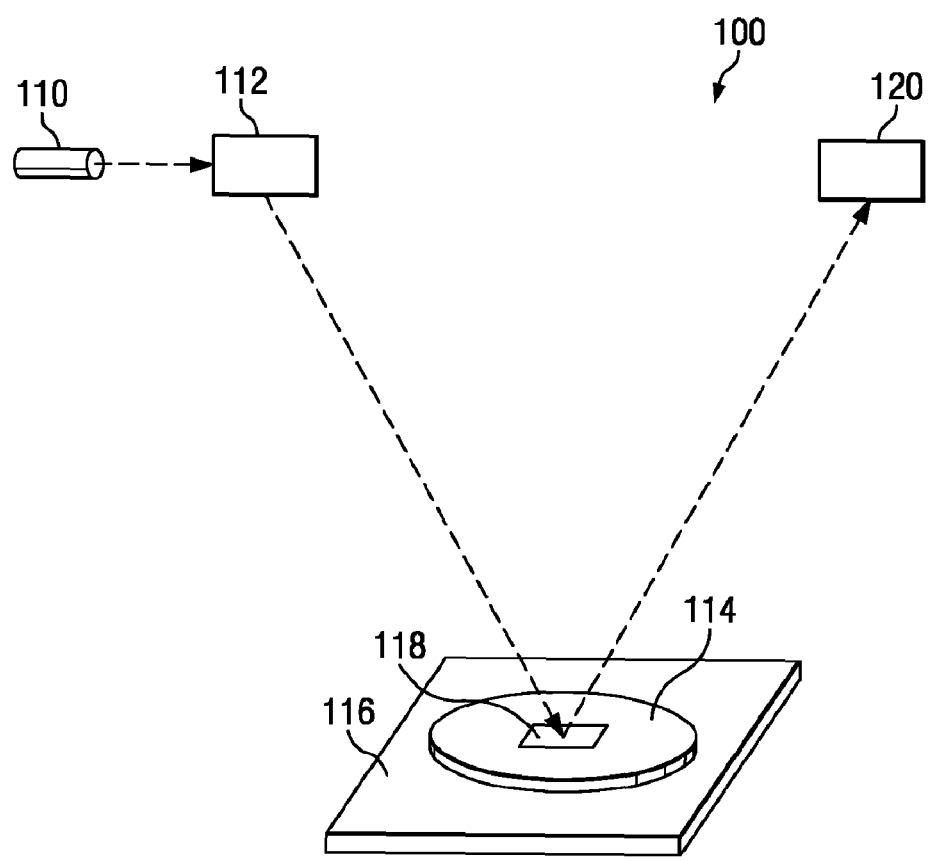
FIG. 1 is a schematic view of one embodiment of a scatterometry-based system for monitoring overlay marks or critical dimension (CD) marks constructed according to aspects of the present disclosure.

FIG. 1 illustrates a schematic view of a scatterometry-based system 100 for monitoring overlay marks or critical dimension (CD) marks constructed according to aspects of the present disclosure. With reference to FIG. 1, the system 100 and the method to use the same to check the scatterometry-based mark are collectively described.

Scatterometry is an optical metrology technique that utilizes a diffraction-based measurement. The scatterometry-based system 100 includes a radiation source 110 to provide radiation beams (radiation energy). In one embodiment, the radiation source 110 is a suitable light source such as a visual light, infrared, violet, or ultra-violet (UV) source. The system includes a scanner 112 operable to direct a light beam from the light source 110 to a wafer 114 positioned on a wafer stage 116. In one embodiment, the wafer stage 116 is operable to move such that the light beam is directed to various scatterometry patterns of the wafer 114. In another embodiment, the scanner 112 is operable to direct the light beam to various scatterometry patterns of the wafer 114. The wafer 114 includes a mark region 118 having a plurality of scatterometry-based (or diffraction-based) marks stacked in the same region, such as a cell area or a scribeline region. In one example, the scattrometry-based marks are alignment marks for monitoring the alignment between the wafer and a photomask. Alternatively, the wafer 114 includes multiple mark regions 118 located at different locations, such as various cell areas and/or scribeline regions.

Each of the multiple mark regions includes a plurality of scatterometry-based marks stacked in the respective region. In one example, the plurality of scatterometry-based marks stacked in one region are overlay masks for monitoring the overlay error between one material layer of the wafer and a patterned photoresist layer formed on the wafer. If the overlay error is greater than an acceptable region, then a rework process may be initiated to remove the patterned photoresist layer and form another patterned photoresist layer.

The system 100 further includes a detector 120 to receive a diffracted light pattern reflected from the wafer 114. The diffracted light signal is used to determine the alignment error or overlay error. In one embodiment, the detector 120 is designed to be operable to move to receive the intended diffracted light signal reflected from the wafer.

Figure 2:
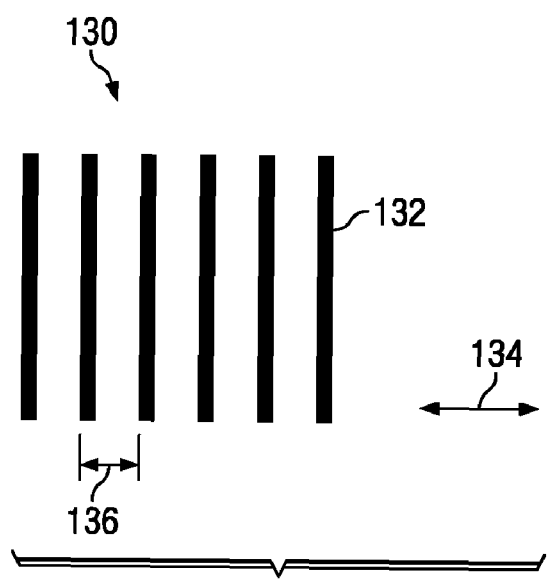
FIG. 2 is a top view of one embodiment of a scatterometry-based mark configured according to aspects of the present disclosure.

FIG. 2 is a top view of one embodiment of a scatterometry-based mark 130 constructed according to various aspects of the present disclosure in various embodiments. The scatterometry-based mark 130 can be used for overlay or alignment monitoring by the scatteromety-based apparatus 100. FIG. 3 is a schematic view of one embodiment of stacked scatterometry-based marks 150. FIG. 4 is a sectional view of one embodiment of an integrated circuit wafer 200 having scatterometry-based marks configured according to aspects of the present disclosure. The integrated circuit wafer 200, the scatterometry-based mark 130, and the stacked scatterometry-based marks 150 are collectively described with reference to FIGS. 2, 3 and 4. The scatterometry-based mark 130 includes a periodic structure capable of generating a diffraction signal by the incident light beam. The periodic structure defines a pitch as a constant of the periodic structure. In one embodiment, the scatterometry-based mark 130 includes a grating structure having multiple lines 132 configured in parallel and periodically. The lines 132 are positioned perpendicular to an orientation 134, referred to as the orientation of the grating. The grating also defines a pitch 136 measured from a location of a line to the same location of an adjacent line, as illustrated in FIG. 2. The pitch is designed to be comparable to the wavelength of the incident light beam for diffraction pattern. The lines and the gaps between lines have different absorption and/or reflection to the incident light beam. For example, the lines are opaque and the gaps between the lines are transparent. The line width may be properly chosen for optimized diffraction signal. The scatterometry-based mark, as illustrated in FIG. 2, is only one embodiment. Other periodic patterns capable of a reliable diffraction signal can be alternatively utilized. For example, the line pattern of the scatterometry mark 132 can be further segmented to comply with the fabrication criteria.

Further referring to FIG. 3, the stacked scatterometry-based marks 150 include a plurality of scatterometry-based marks stacked in the same region. Each one is similar to the mark 130 of FIG. 2. For example, each mark includes a grating structure with a pitch and an orientation. However, the plurality of scatterometry-based marks are designed to have various pitches and orientations. In this example, there are four material layers formed on a wafer. The first layer includes a first grating mark 152 having a first pitch and a first orientation. The second layer is overlying on the first layer and includes a second grating mark having the first pitch and a second orientation. In this particular case, the second orientation is perpendicular to the first orientation. The third layer is overlying on the second layer and includes a third grating mark having the second pitch and the first orientation. The fourth layer is overlying on the third layer and includes a fourth grating mark having the second pitch and the second orientation. Therefore, as the stacked marks have various pitches and orientations, the reflected diffraction signal from each mark is separated from the signals from the other marks in the detection field. In one embodiment, the above scatterometry-based marks can be used as alignment marks for alignment between a photomask and the wafer.

In another embodiment, the stacked scatterometry-based marks are paired. Each pair are formed in two adjacent layers as overly marks to check overlay error between the two adjacent layers. In furtherance of the embodiment, FIG. 4 provides an example of stacked scatterometry-based marks formed in an integrated circuit wafer 200 and used as overlay marks. In this example, the integrated circuit wafer 200 includes a substrate 202. In one example, the substrate 202 includes silicon. The substrate 202 may alternatively includes other semiconductor material, such as silicon germanium and/or silicon carbide. Formed on the substrate 202 are eight exemplary material layers 204, 206, 208, 210, 212, 214, 216 and 218. In one example, the eight material layers are eight metal layers for interconnection. Each layer includes metal lines or vias/contacts. In one example, the metal layers can be formed by a dual damascene process.

The eight layers 204-218 also include scatterometry-based overlay marks 222, 224, 226, 228, 230, 232, 234 and 236, each disposed in one respective layer and stacked in the region 220. Each of the overlay marks can be simultaneously formed with the respective circuit pattern (metal features in this example) in the same process, such as the dual damascene process. Particularly, the first mark 222 in the first layer 204 and the second mark 224 in the second layer 206 have the same pitch and orientation. The marks 222 and 224 are paired for monitoring overlay between the first and second layers. The marks 222 and 224 may have a proper offset for optimized overlay sensitivity. In furtherance of the example, the marks 222 and 224 are substantially similar to the first grating mark 152 of FIG. 3 having the first pitch and the first orientation. Similarly, the third mark 226 in the third layer 208 and the fourth mark 228 in the fourth layer 210 have the same pitch and orientation. The marks 226 and 228 are paired for monitoring overlay between the third and fourth layers. The marks 226 and 228 may have a proper overlay offset for optimized overlay sensitivity.

In furtherance of the example, the marks 226 and 228 are substantially similar to the second grating mark 154 of FIG. 3 having the first pitch and the second orientation. Likewise, the fifth mark 230 in the fifth layer 212 and the sixth mark 232 in the sixth layer 214 have the same pitch and orientation. The marks 230 and 232 are paired for monitoring overlay between the fifth and sixth layers. In furtherance of the example, the marks 230 and 232 are substantially similar to the third grating mark 156 of FIG. 3 having the second pitch and the first orientation. Likewise, the seventh mark 234 in the seventh layer 216 and the eighth mark 236 in the eighth layer 218 have the same pitch and orientation. The marks 234 and 236 are paired for monitoring overlay between the seventh and eighth layers. In furtherance of the example, the marks 234 and 236 are substantially similar to the fourth grating mark 158 of FIG. 3 having the second pitch and the second orientation.

The disclosed scatterometry-based overlay marks in a stack include various pitches and orientations, therefore directing diffraction light signals from the marks to different directions and improving the analysis of the diffraction light signals. Accordingly, the stacking density can be increased to save the chip area. The stacked marks 200 are only an example and may include various alternatives and extensions. For example, the eight layers may alternatively include polysilicon layer, contact, metal 1, via 1, metal 2, via 2, metal 3, and via 3. In another example, the region 220 of the stacked overlay marks is in a location of a circuit cell or in a location of scribe line. The wafer 200 usually includes a plurality of die separated by scribe lines. In one embodiment, the wafer includes a plurality of stacked scatterometry-based overlay marks respectively formed in various locations of various die and/or various locations of the scribe lines. Each stacked marks are designed similar to the stacked marks 150 of FIG. 3, having periodic structures with various pitches and/orientations. Each stack is designed for monitoring overlay error in that location. Furthermore, each stack is designed for monitoring overlay errors between certain layers. Other stacked marks may be designed for monitoring overlay errors between some other layers. For illustration, FIG. 5 provides an example of scatterometry-based overlay marks configured in various locations.

Figures 5, 8:
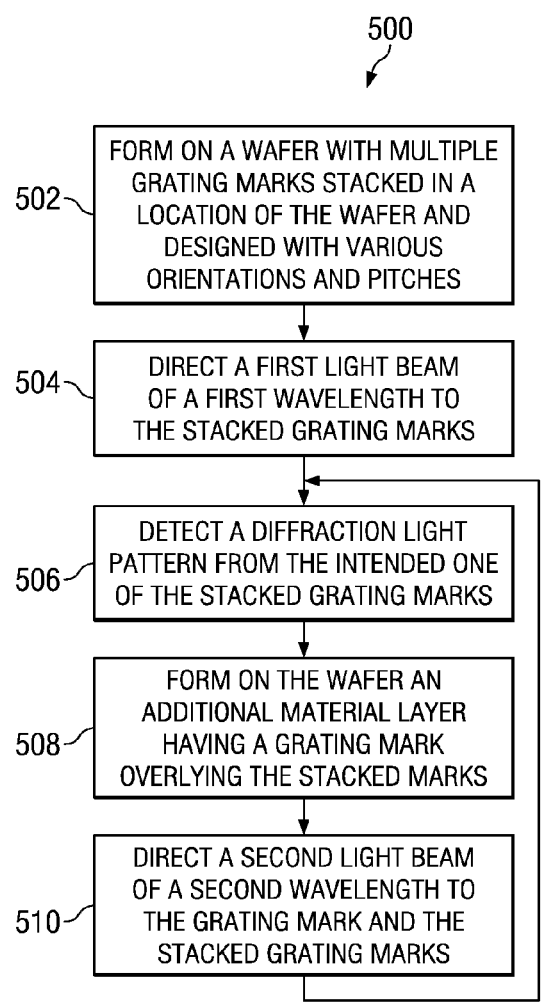
FIG. 5 is a table illustrating scatterometry-based marks constructed according to various aspects of the present disclosure.
FIG. 8 is a flowchart of a method to utilize scatterometry-based marks constructed according to various aspects of the present disclosure.

FIG. 5 is a table 300 illustrating scatterometry-based marks constructed according to various aspects of the present disclosure. The table 300 includes a plurality of rows, representing various material layers formed on wafer. The table 300 includes four columns, representing four different locations on the wafer. An additional column is provided on the left of the table to label each material layer. For example, "M5" represents metal 5. In furtherance of the example, the plurality of the material layers includes "OD" for a dielectric layer (i.e. SiO/SiN) defining active areas, "PO" for a polysilicon layer, "CT" for contact layer, "M1" for metal 1, "VA1" for via 1, "M2" for metal 2, "VA2" for via 2, . . . , "M9" for metal 9, "VA9" for via 9, "M10" for metal 10, "TV1" for top via, "TM1" for top metal, and "Passivation" for a passivation layer. An additional row is provided on the bottom of the table to label each location as "1", "2", "3", and "4", respectively. The first set of scatterometry-based marks is formed in the location "1", the second set of marks is formed in the location "2", the third in the location "3" and the fourth in the location "4". In the table, "A" represents a first type of mark with its respective pitch and orientation. "B" represents a second type of mark with its respective pitch and orientation. Similarly, "C" represents a third type of mark with its respective pitch and orientation. "D" represents a fourth type of mark with its respective pitch and orientation.

In one example, the first type of mark "A" is similar to the first grating mark 152 of FIG. 3. The second type of mark "B" is similar to the second grating mark 154 of FIG. 3. The third type of mark "C" is similar to the third grating mark 156 of FIG. 3. The fourth type of mark "D" is similar to the fourth grating mark 158 of FIG. 3. Furthermore, "X" represents a blocking feature to block the incident light. In one example, a metal feature serves as a blocking feature. In the scheme provided in the table 300, the stacked marks in the first location "1" includes a paired marks "A" in the "PO" layer and "A" in the "OD" layer. Similarly, the second paired marks include "B" in the "CT" layer and "B" in the "M1" layer. The third paired marks include "C" in the "VA1" layer and "C" in the "M2" layer. The fourth paired marks include "D" in the "VA2" layer and "D" in the "M3" layer. Since the stacked marks are designed with different pitches and orientations, the detected diffraction pattern from each paired marks are separated from each other, thus no spacing layers and blocking layers are needed. The stacking efficiency is improved. The stacked density is increased and the chip area is saved.

Figure 6:
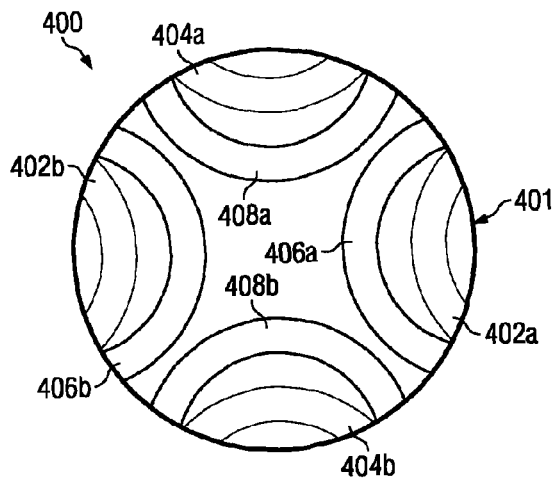
FIG. 6 illustrates one embodiment of detected diffraction patterns.

Particularly, FIG. 6 illustrates a detected diffraction patterns 400 in a detection field 401 (or pupil plane). The detected light patterns 400 include various diffraction pattern from the respective paired marks. In this example, the detected light patterns 400 include diffraction patterns 402, 404, 406 and 408. The diffraction pattern 402 is from the first paired marks "A" and "A". The diffraction pattern 404 is from the second paired marks "B" and "B". The diffraction pattern 406 is from the third paired marks "C" and "C". The diffraction pattern 408 is from the fourth paired marks "D" and "D". The diffraction pattern 402 includes 402*a* and 402*b*. In one example, the 402*a* is associated with +1 order diffraction and 402*b* is associated with −1 order diffraction from the first paired marks. Similarly, the 404*a* is associated with +1 order diffraction and 404*b* is associated with −1 order diffraction from the second paired marks, and so on. Similarly, the 406*a* is associated with +1 order diffraction and 406*b* is associated with −1 order diffraction from the second paired marks. Similarly, the 408*a* is associated with +1 order diffraction and 408*b* is associated with −1 order diffraction from the second paired marks. The diffraction patterns 400 are in a geometry of ring if the incident light beam is shaped as a ring.

Figure 7:
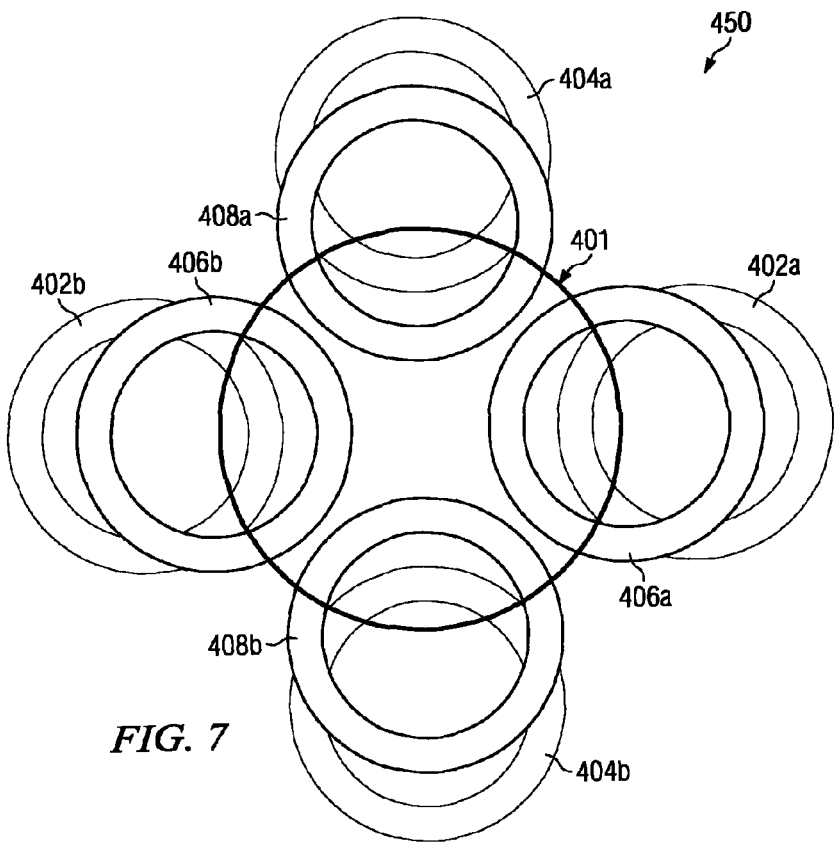
FIG. 7 illustrates one embodiment of diffraction patterns partially in a detection field and partially outside thereof.

For example, a diffraction optical element may be incorporated in the incident light path to form a ring shaped incident light beam. FIG. 7 illustrates diffraction patterns 450 partially in the detected field and partially outside thereof. However, the incident light beam in other geometry may be used and the detected diffraction patterns are accordingly in different geometry. In one embodiment, various geometries of the incident light beam can be utilized for reading different pair of scatterometry marks so to further distinguish signal positions on the detection zone from various marks and to further increase the mark stacking efficiency.

FIG. 8 provides a flowchart of a method 500 to utilize the scatterometry-based marks according to one or more embodiment of the present disclosure. With reference to FIGS. 1 through 8, the method 500 is described below. The method 500 begins at step 502 by forming on a wafer with multiple scatterometry-based marks in a location of the wafer and designed with various orientations and pitches. Each paired marks may be formed in two material layers with a certain overlay offset for optimized detection sensitivity. Additionally, spacing features and/or blocking features may be formed in the stack for proper signal isolation. In another embodiment, a plurality of sets of stacked scatterometry-based marks are formed various locations of the wafer according to particular applications, such as monitoring overlay errors. In one example, the stacked marks are similar to the stacked marks 150 of FIG. 3. In another example, the stacked marks are similar to the stacked marks in the location 220 illustrated in FIG. 4.

The method 500 proceeds to step 504 by directing a first light beam of a first wavelength to the stacked grating marks. The first wavelength is chosen such that the intended diffraction pattern is directed to the detection field. Unexpected diffraction signals are partially or substantially outside of the detection field.

The method 500 proceeds to step 506 by detecting a diffraction light pattern from an intended mark or pair of marks. Based on the diffraction light signal detected by the detector, the alignment error or overlay error can be determined.

The method 500 proceeds to step 508 by forming on the wafer another material layer and a grating mark at the location of the stacked grating marks so that the grating mark is overlying the stacked grating marks. In one embodiment, the material layer may include metal or dielectric material. The material layer includes a designed circuit pattern. In another embodiment, the material layer includes a patterned photoresist layer. The grating mark is designed with a pitch and an orientation paired with the underlying layer or different from at least a portion of the underlying layers in terms of pitch and orientation. Alternatively, the grating mark is formed in a location of another stacked marks.

The method 500 proceeds to step 510 by directing a second light beam of a second wavelength to the stacked grating marks. The second wavelength is chosen to be different from the first wavelength such that the intended diffraction pattern from the grating mark is directed to the detection field. Unexpected diffraction signals are partially or substantially outside of the detection field.

The method 500 proceeds to 506 by detecting a diffraction light pattern from the grating mark or additionally with paired mark. Based on the diffraction light signal detected by the detector, the alignment error or overlay error can be determined.

The method 500 may further proceed to repeat the steps 506 through 510 until all material layers are formed on the wafer. In one example, a new grating mark may be formed in various stacks, such as stacks "1" through "4". As another example when the new grating mark is used as an overlay mark, if the overlay error is out of specification, the patterned photoresist layer can be reworked with a process including stripping, coating, exposing and developing. In another example, the new grating mark is used as an overlay mark. The alignment control unit will automatically adjusting alignment between the wafer and a photomask until the alignment error is minimized or with the specification. In this case, the scatterometry system, such as the system 100, may be integrated with a lithography exposure apparatus.

The present disclosure provides various embodiments of stacked scatterometry-based marks, scatterometry system, and method utilizing the same. Other variations may also be possible within the scope of the invention. In one embodiment, the orientations of the stacked grating marks may also include other directions in addition to two perpendicular directions, referred to as x-direction and y-direction. For example, the orientations between x and y directions may be additionally utilized. In another embodiment, the paired scatterometry-based marks may have optimized offset for improved sensitivity when monitoring the overlay error. In another embodiment, the scanner 112 may additionally include a mirror to direct the incident light beam to the wafer. The scanner is operable to scan various stacked sctterometry-based marks for the various overlay errors between different layers and at different locations.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An integrated circuit, comprising:
   a semiconductor substrate;
   a plurality of material layers including a first material layer, a second material layer, and a third material layer formed on the semiconductor substrate, each of the material layers including a circuit pattern therein, wherein the third material layer is disposed over and in contact with the second material layer and the second material layer is disposed over and in contact with the first material layer; and
   a plurality of diffraction-based periodic marks formed in the plurality of material layers and stacked in a same region, wherein the plurality of diffraction-based periodic marks includes a first diffraction-based periodic mark disposed in the first material layer, a second diffraction-based periodic mark disposed in the second material layer, and a third diffraction-based periodic mark disposed in the third material layer, and
   wherein the third diffraction-based periodic mark has an orientation that is different than the second diffraction-based periodic mark.

2. The integrated circuit of claim 1, wherein two of the diffraction-based periodic marks include a same pattern and are formed in adjacent material layers for overlay monitoring.

3. The integrated circuit of claim 1, wherein one of the material layers includes a material selected from the group consisting of polysilicon, copper, silicon oxide, and silicon.

4. The integrated circuit of claim 1, wherein each of the diffraction-based periodic marks includes a grating structure.

5. The integrated circuit of claim 4, wherein the one of the diffraction-based periodic marks includes a first orientation different from a second orientation of another one of the diffraction-based periodic marks.

6. The integrated circuit of claim 5, wherein the first orientation is perpendicular to the second orientation.

7. The integrated circuit of claim 1, further comprising a blocking feature interposed between two of the diffraction-based periodic marks.

8. The integrated circuit of claim 1, further comprising a plurality of additional diffraction-based periodic marks formed in the plurality of material layers and stacked in another region, wherein one of the additional diffraction-based periodic marks is different from at least one other of the additional diffraction-based periodic marks in pitch.

9. An integrated circuit, comprising:
   a plurality of material layers formed on a substrate; and
   pairs of grating marks formed in the plurality of material layers and stacked in a same region of the substrate when viewed in a direction perpendicular to the substrate, each of the grating marks within each pair has a periodic structure with a pitch and an orientation, wherein the pitch and the orientation of the grating marks within each pair of the grating marks are the same, wherein the grating marks of each pair are formed in adjacent material layers,
   wherein one pair of the grating marks is different from other pairs of the grating marks in at least one of the pitch and the orientation.

10. The integrated circuit of claim 9, wherein the one pair of the grating marks includes an offset between the grating marks when viewed in the direction perpendicular to the substrate.

11. The integrated circuit of claim 9, further comprising multiple sets of grating marks formed in the material layers, each set of the grating marks is stacked in a respective region of the substrate.

12. The integrated circuit of claim 11, wherein grating marks in a first set are formed respectively in a first layer and a second layer adjacent to the first layer; and
   wherein grating marks in a second set are formed respectively in the second layer and a third layer adjacent to the second layer.

13. The integrated circuit of claim 9, wherein the plurality of material layers are formed in one of a cell area and scribe line area.

* * * * *